(12) United States Patent
Shrestha et al.

(10) Patent No.: US 12,385,962 B2
(45) Date of Patent: Aug. 12, 2025

(54) FAULT LOCATION ESTIMATION USING INCREMENTAL QUANTITIES

(71) Applicant: Schweitzer Engineering Laboratories, Inc., Pullman, WA (US)

(72) Inventors: Arun Shrestha, Charlotte, NC (US); Sathish Kumar Mutha, Pullman, WA (US); Brian A. Smyth, Butte, MT (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 17/937,824

(22) Filed: Oct. 4, 2022

(65) Prior Publication Data

US 2024/0118330 A1 Apr. 11, 2024

(51) Int. Cl.
*G01R 31/08* (2020.01)
*G01R 31/52* (2020.01)

(52) U.S. Cl.
CPC ......... *G01R 31/086* (2013.01); *G01R 31/088* (2013.01); *G01R 31/52* (2020.01)

(58) Field of Classification Search
None
See application file for complete search history.

(56) References Cited

U.S. PATENT DOCUMENTS

| | | | |
|---|---|---|---|
| 4,107,778 A * | 8/1978 | Nii | G01R 31/088 702/59 |
| 4,161,011 A | 7/1979 | Wilkinson | |
| 4,367,507 A * | 1/1983 | Shperling | H02H 9/08 307/103 |
| 4,405,966 A | 8/1983 | Cavero | |
| 4,825,327 A | 4/1989 | Alexander | |
| 5,140,492 A | 8/1992 | Schweitzer | |
| 5,703,745 A | 12/1997 | Roberts | |
| 6,028,754 A | 2/2000 | Guzman-Casillas | |
| 6,721,671 B2 | 4/2004 | Roberts | |
| 7,660,088 B2 | 2/2010 | Mooney | |
| 8,410,785 B2 | 4/2013 | Calero | |
| 8,525,522 B2 | 9/2013 | Gong | |
| 8,558,551 B2 | 10/2013 | Mynam | |
| 8,736,297 B2 | 5/2014 | Yelgin | |
| 8,942,954 B2 | 1/2015 | Gong | |

(Continued)

OTHER PUBLICATIONS

Edmund O. Schweitzer, III, Evaluation and Development of Transmission Line Fault Locating Techniques Which Use Sinusoidal Steady-State Information, 9th Annual Western Protective Relay Conference, Oct. 26-28, 1982.

(Continued)

*Primary Examiner* — Catherine T. Rastovski
*Assistant Examiner* — Brian Butler Geiss
(74) *Attorney, Agent, or Firm* — Fletcher Yoder, P.C.

(57) ABSTRACT

A method and a system are used to analyze incremental quantities. The electrical measurements associated with a loop in a multiple-phase electric power delivery system are obtained before a fault occurred on the loop and after the fault occurred on the loop, and differences between the electrical measurements are used to determine incremental quantities. The incremental quantities are used to determine a location of the fault on the loop. Multiple loops in the multiple-phase electric power delivery system may be monitored to determine corresponding fault locations on each loop.

19 Claims, 8 Drawing Sheets

(56) References Cited

U.S. PATENT DOCUMENTS

| | | | |
|---|---|---|---|
| 9,257,827 | B2 | 2/2016 | Calero |
| 10,162,015 | B2 | 12/2018 | Xu |
| 10,197,614 | B2 | 2/2019 | Benmouyal |
| 10,261,567 | B2 | 4/2019 | Mynam |
| 10,436,831 | B2 | 10/2019 | Kang |
| 10,649,020 | B2 | 5/2020 | Achanta |
| 11,169,195 | B2 | 11/2021 | Naidu |
| 11,346,878 | B2 | 5/2022 | Benmouyal |
| 11,650,241 | B1 | 5/2023 | Juvekar |
| 2004/0167729 | A1* | 8/2004 | Saha ............ G01R 31/088 702/58 |
| 2009/0150099 | A1 | 6/2009 | Balcerek |
| 2011/0264389 | A1 | 10/2011 | Mynam |
| 2012/0004867 | A1 | 1/2012 | Mousavi |
| 2014/0236502 | A1 | 8/2014 | Calero |
| 2014/0351472 | A1 | 11/2014 | Jebson |
| 2016/0077150 | A1* | 3/2016 | Schweitzer, III ........ H02H 7/20 307/125 |
| 2017/0003335 | A1 | 1/2017 | Kang |
| 2017/0227611 | A1 | 8/2017 | Xu |
| 2021/0063460 | A1* | 3/2021 | Dase ............... H02H 7/261 |

OTHER PUBLICATIONS

Yanfeng Gong, Mangapathirao Mynam, Armando Guzman, Gabriel Benmouyal, Boris Shulim, Automated Fault Location System for Nonhomogeneous Transmission Networks, 37th Annual Western Protective Relay Conference, Oct. 19-21, 2010.

Gabriel Benmouyal, Jeff Roberts, Superimposed Quantities: Their True Nature and Application in Relays, 26th Annual Western Protective Relay Conference, Oct. 26-28, 1999.

Fernando Calero, Daqing Hou, Practical Single-Pole Line Protection Scheme Considerations, 31st Annual Western Protective Relay Conference, Oct. 19-21, 2004.

Gabriel Benmouyal, Armando Guzman, Rob Jain, Tutorial on the Impact of Network Parameters on Distance Element Resistance Coverage, 40th Annual Western Protective Relay Conference Oct. 15-17, 2013.

E.O. Schweitzer, III, Armando Guzman, Mangapathirao Mynam, Veselin Skendic, Bogdan Kasztenny, Stephen Marx, Locating Faults by the Traveling Waves They Launch, 40th Annual Western Protective Relay Conference Oct. 15-17, 2013.

Tony Jiao, Charles Henville, Evolving Transmission Line Faults While Single Phase Open, 41st Annual Western Protective Relay Conference, Oct. 13-16, 2014.

Gabriel Benmouyal, Normann Fischer, Brian Smyth "Performance Comparison Between Mho Elements and Incremental Quantity-Based Distance Elements" Jan. 30, 2017.

Bogdan Kasztenny "Distance Elements for Line Protection Applications Near Unconventional Sources" Schweitzer Engineering Laboratories, Inc. Jun. 17, 2021.

* cited by examiner

FAULT LOCATION ESTIMATION USING INCREMENTAL QUANTITIES

BACKGROUND

This disclosure relates to locating faults in electric power delivery systems. More particularly, this disclosure relates to determining a fault location in electric power delivery systems by using incremental quantities.

Transmission line protection improves power system stability in power delivery systems. If faults are not cleared before the critical fault clearing time, the system may lose transient stability and possibly suffer a blackout. Accurate fault location of transmission line faults allows crews to make repairs and restore power quickly. Fault location is critical for improving power system reliability and is of great value to power system operators and transmission asset owners.

DETAILED DESCRIPTION

Figure 1:
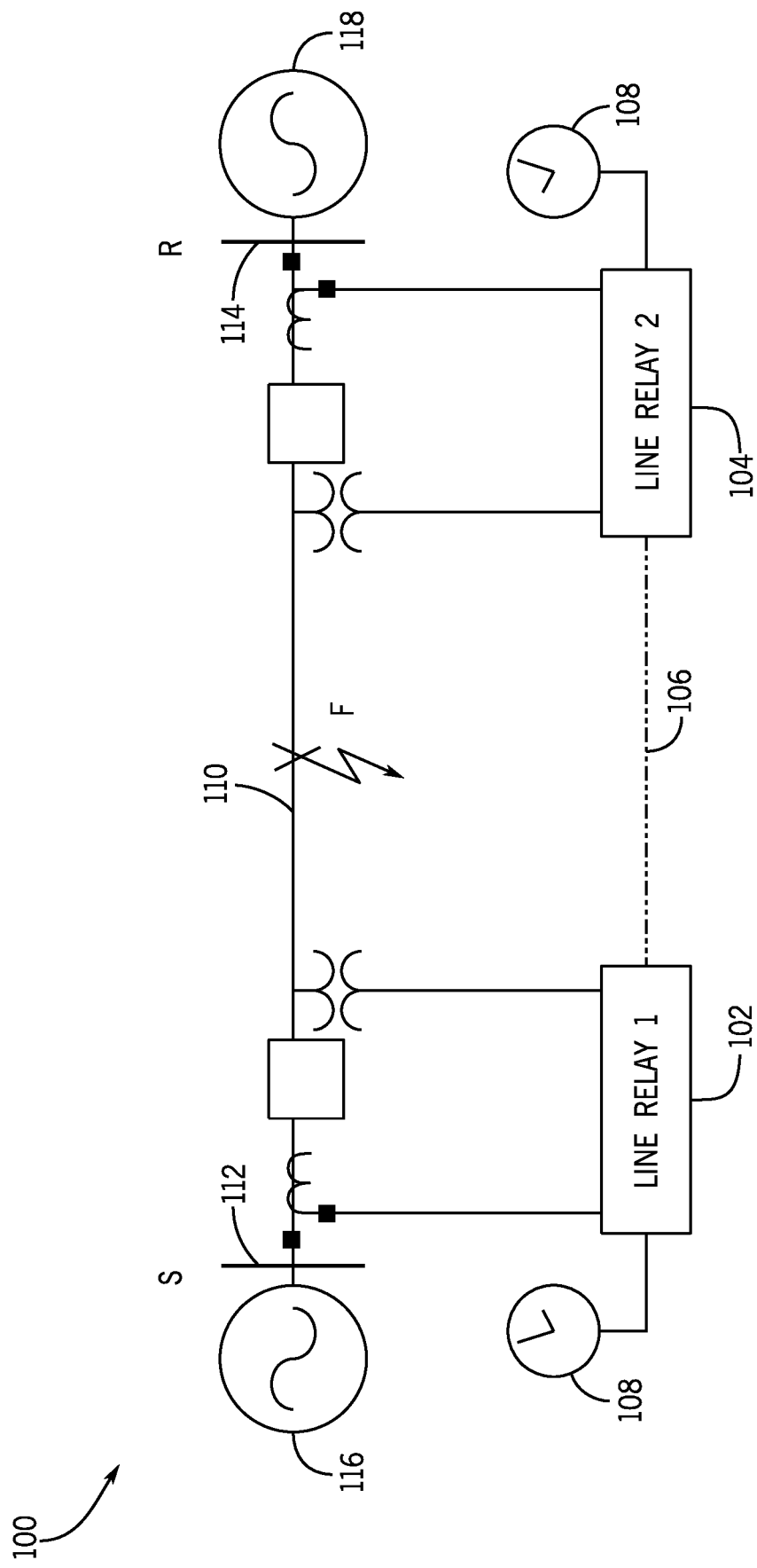
FIG. 1 is a block diagram of a system with a source terminal S and a remote terminal R, with a fault on a line between terminals S and R, in accordance with an embodiment.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase "A or B" is intended to mean A, B, or both A and B.

Various embodiments consistent with the present disclosure may analyze incremental quantities, which are calculated by subtracting pre-fault quantities from faulted quantities. Incremental quantities, also known as superimposed quantities, represent signals that appear in a fault network of a power network. The fault network (or pure-fault network) is the difference between the faulted network and pre-fault network. Pre-fault network refers to the power network before a fault occurred, and the faulted network refers to the power network after the fault occurred. These quantities are typically represented with a prefix Δ to indicate the change with respect to the pre-fault network signals. That is, the present disclosure solves for a fault network rather than faulted network. By way of example, electrical measurements associated with a loop in a multiple-phase electric power delivery system may be obtained before a fault occurred on the loop (pre-fault sequence quantities) and after the fault occurred on the loop (faulted sequence quantities), and differences between the electrical measurements are incremental quantities, which may give insight into information related to the fault (e.g., fault location). For instance, the incremental voltage and current quantities may be expressed as shown below:

$$\Delta V = V_{Faulted} - V_{Pre-fault} \quad (1)$$

$$\Delta I = I_{Faulted} - I_{Pre-fault} \quad (2),$$

where $V_{Faulted}$ is the voltage measurement associated with the loop after the fault occurred on the loop and $V_{Pre-fault}$ is the corresponding voltage measurement before the fault occurred on the loop, and $I_{Faulted}$ is the current measurement associated with the loop after the fault occurred on the loop and $I_{Pre-fault}$ is the corresponding voltage measurement before the fault occurred on the loop.

In a power network with balanced voltage sources, transposed lines, and balanced loads, only positive-sequence current and voltage may exist in the pre-fault network. Negative-sequence and zero-sequence quantities are zero. For such a network, the calculated negative- and zero-sequence quantities in the faulted network are incremental negative- and zero-sequence quantities in the fault network. However, in practice, transmission lines are often not transposed due to several factors, including the cost and potential faults caused by line slap at the interchange of phase locations. Untransposed lines create unbalance in the pre-fault network, resulting in generation of negative- and zero-sequence voltages and currents. These sequence quantities impact performance of many power system components, including protective relaying. With non-zero negative- and zero-sequence quantities in the pre-fault network, incremental quantities in the fault network are no longer the negative- and zero-sequence quantities in the faulted network. Accordingly, using the negative- and zero-sequence quantities in the faulted network to estimate fault location may involve errors due to the non-zero negative- and zero-sequence quantities in the pre-fault network. Therefore, it is beneficial to use incremental quantities to estimate fault locations for power system with unbalance (e.g., with untransposed lines) in pre-fault network. In addition, positive-sequence incremental quantities, may be calculated by subtracting positive-sequence quantities between faulted and pre-fault networks for both balanced network and unbalanced network.

In certain embodiments, sensors may be used to monitor an electric power delivery system (e.g., electrical operating parameters). For instance, sensors (e.g., electrical sensors, temperature sensors, intelligent electronic devices (IEDs), and so forth) may be used and powered by a battery (e.g., rechargeable battery, either standing alone or connected to a power system, which may be charged when power is available), or by an additional power supply (e.g., power backup system, solar panel power system or other alternative power system, and so forth), or any combination of them (e.g., converting to other power supply methods when there is an outage on one power supply). The sensors may be coupled to an existing monitoring system, or may be standalone sensors. The sensors may be used to monitor the electric power delivery system for a period of time. In certain embodiments, the sensors may measure values of electrical operating parameters of a particular loop in a multiple-phase electric power delivery system and send the sensor data to an electrical monitoring system.

In certain embodiments, the electrical monitoring system may receive measurements of electrical operating parameters at a source terminal and a remote terminal on a particular loop before a fault occurred on the loop (pre-fault parameters), such that the fault occurred at a location between the source terminal and the remote terminal. The electrical monitoring system may then receive measurements of electrical operating parameters at the source terminal and the remote terminal of the particular loop after the fault occurred on the loop. With this in mind, the electrical monitoring system may compare the values of the operating parameters measured at the source terminal (or the remote terminal) before the fault occurred on the loop and after the fault occurred on the same loop to obtain respective incremental quantities for the source terminal (or the remote terminal).

The electrical monitoring system may then use incremental quantities for a source terminal and a remote terminal on a particular loop to determine the fault location between the source terminal and the remote terminal by using methods and techniques described in greater detail herein. The electrical monitoring system may send instructions to activate certain actions (e.g., protective actions) based on the determined fault location.

The electrical monitoring system may monitor incremental quantities for source terminals and remote terminals on more than one loops in a multiple-phase electric power delivery system in order to determine the fault location on a particular loop. Indeed, by monitoring the incremental quantities for respective source terminal and respective remote terminal on the multiple loops, the electrical monitoring system may be able to determine the fault locations on additional loops of the multiple-phase electric power delivery system. In addition, each of the above described embodiments may be performed continuously to provide for real-time monitoring and fault location identification. To analyze faults on a transmission line in a complex network, the overall network can be simplified into two-source power system connected by the transmission line of interest using Thevenin's theorem as applied to a network that experiences a fault, as illustrated in FIG. 1.

By way of introduction, FIG. 1 illustrates a block diagram of a system 100 for determining and calculating a location of a fault using incremental quantities further described herein. System 100 may include generation, transmission, distribution and/or similar systems. System 100 illustrates a two-terminal line, and line relays, i.e., line relay 1 and line relay 2, are installed at each end. System 100 may be monitored by IEDs (and/or other suitable sensors, such as electrical sensors or temperature sensors, and so forth) 102 and 104 at the two relays of the system, although further IEDs may also be utilized to monitor further locations of the system. A data communication channel 106 may allow the IEDs 102 and 104 to exchange information relating to, among other things, voltages, currents, fault detections, fault locations, and the like. The IEDs 102 and 104 may also receive common time information from a common time source 108. System 100 includes a conductor 110, such as a transmission line connecting two nodes, which are illustrated as a source terminal (S) 112 and a remote terminal (R) 114. A fault may occur on the transmission line at a location between the source terminal 112 and the remote terminal 114, which is indicated by F in FIG. 1. The source terminal 112 and the remote terminal 114 may be part of buses in a transmission system supplied by generators 116 and 118, respectively. Although illustrated in single line form for purposes of simplicity, system 100 may be a multi-phase system, such as a three-phase electric power delivery system.

As used herein, an IED (such as IEDs 102 and 104) may refer to any microprocessor-based device that monitors, controls, automates, and/or protects monitored equipment within system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs. The IEDs 102 and 104 may obtain electric power system information using current transformers (CTs), potential transformers (PTs), Rogowski coils, voltage dividers and/or the like. The IEDs 102, 104 may be capable of using inputs from conventional instrument transformers such as CTs and PTs conventionally used in monitoring of electric power delivery.

The common time source 108 may be any time source capable of delivering a common time signal to each of IEDs 102 and 104. Some examples of a common time source include a Global Navigational Satellite System (GNSS) such as the Global Positioning System (GPS) delivering a time signal corresponding with IRIG (Inter-Range Instrumentation Group), a network-based system such as corresponding with IEEE 1588 precision time protocol, and/or the like. According to one embodiment, the common time source 108 may comprise a satellite-synchronized clock (e.g., Model No. SEL-2407, available from SEL). Further, it should be noted that each IED 102, 104 may be in communication with a separate clock, such as a satellite-synchronized clock, with each clock providing each IED 102, 104 with a common time signal. The common time signal may be derived from a GNSS system or other time signal.

According to some embodiments, a time signal based on the common time source 108 may be distributed to and/or between LEDs 102 and 104 using data communication channel 106. Data communication channel 106 may be embodied in a variety of media and may utilize a variety of communication protocols. For example, the data communication channel 106 may be embodied utilizing physical media, such as coaxial cable, twisted pair, fiber optic, etc. Further, the data communication channel 106 may utilize communication protocols such as Ethernet, SONET, SDH, or the like, in order to communicate data.

In several embodiments, incremental quantities may be used to determine and calculate location of a fault. Faulted voltages and current signals are determined directly from time synchronized signals. These faulted signals (e.g., faulted sequence quantities) are measured after the fault occurred on the loop and are sums of corresponding pre-fault signals (e.g., pre-fault sequence quantities) and fault-generated signals. Hence, the principle of superposition can be used to represent any faulted network as a summation of two separate networks, a pre-fault network, and a pure-fault network. The fault generated signals (e.g., pure fault V and I) are a difference between faulted signals and the pre-fault signals, as expressed in equations (1) and (2) and further illustrated in FIG. 2.

Figure 2:
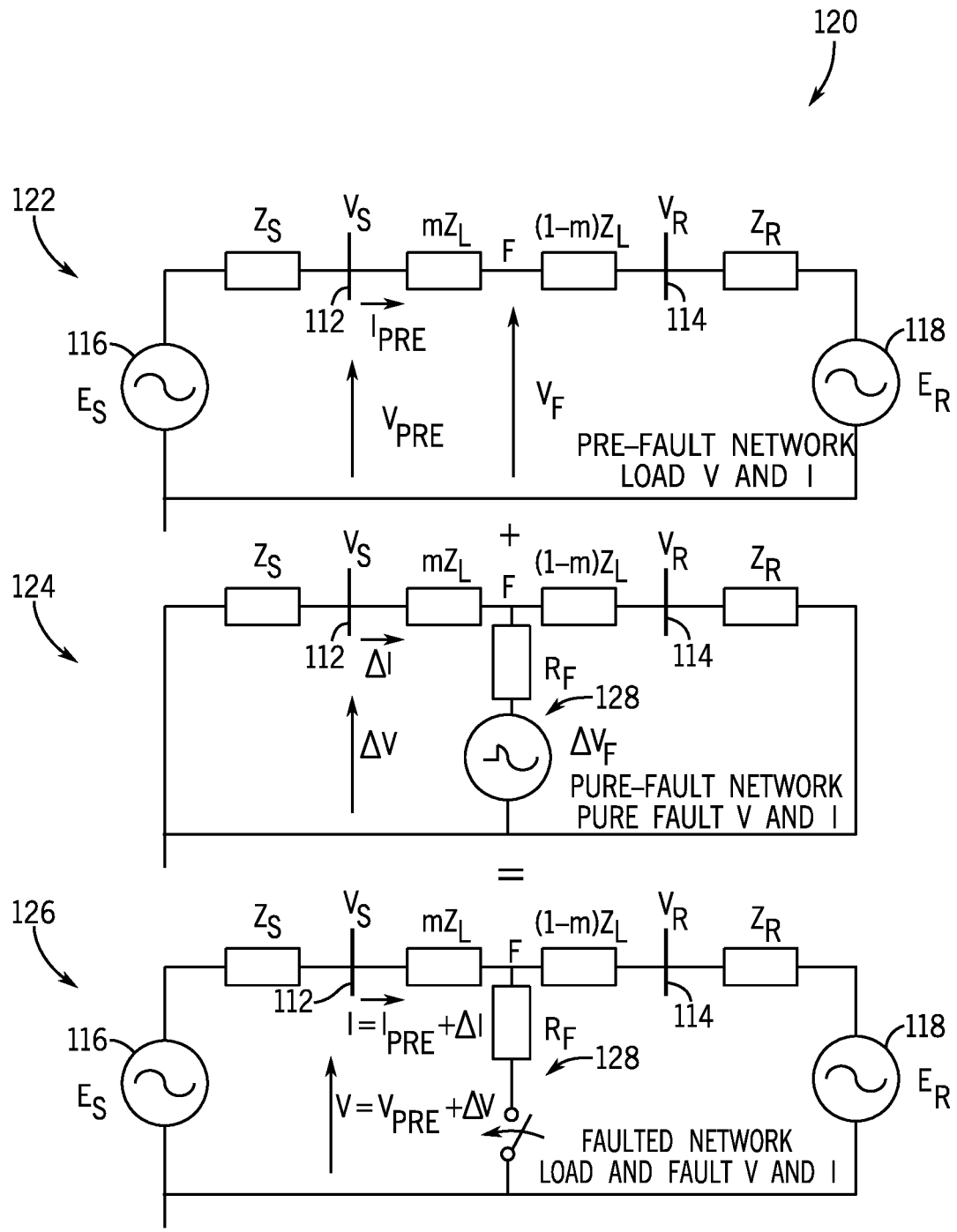
FIG. 2 illustrates circuit block diagrams modeling the faulted circuit shown in FIG. 1, in accordance with an embodiment.

FIG. 2 illustrates a relationship 120 of a pre-fault network 122, a fault network 124, and a faulted network 126, with a fault 128 occurred at a location F between terminals 112 and 114. That is, the faulted sequence quantities in the faulted network 126 are sums of corresponding pre-fault sequence quantities in the pre-fault network 122 and corresponding fault sequence quantities in the fault network 124. The source terminal 112 and the remote terminal 114 may include sensor units, such as LEDs 102 and 104, for detecting electrical properties (e.g., voltage and current) at the respective locations in the network.

The pre-fault network 122 contains pre-fault sequence quantities, such as $V_{Pre\text{-}fault}$ and $I_{Pre\text{-}fault}$. The pre-fault network drives the load current through the network and establishes $V_F$ voltage at the fault location F. The pre-fault network provides the initial condition for the pure-fault Thevenin source, and $V_F$ is the voltage at location F before the fault 128 occurred. $Z_s$ is the impedance of the source terminal (S) 112, $Z_R$ is the impedance of the remote terminal (R) 114, $Z_L$ is the line impedance, and m is the per unit fault location from the source terminal 112.

In the fault network 124, all pre-fault network voltage sources are short-circuited and the Thevenin source voltage equals to the negative of pre-fault voltage at the fault location ($-V_F$). It is assumed that any currents and voltages in the fault network depend only on the network parameters. The fault network currents and voltages are zero before the fault. That is, the pure-fault network currents and voltages are zero before the fault occurred, i.e., $\Delta V=0$ and $\Delta I=0$ before the fault occurred. After the fault 128 occurred, a fault resistance $R_F$ appears at the location F, and $\Delta V_F$ is a nonzero value. That is, the fault network 124 contains the incremental voltage $\Delta V$ and the incremental current $\Delta I$ that may be used to calculate the fault location F for the fault 128 as further described herein.

The faulted network 126 contains faulted sequence quantities, such as $V_{Faulted}$ and $I_{Faulted}$, that may be used with the pre-fault sequence quantities, such as $V_{Pre\text{-}fault}$ and $I_{Pre\text{-}fault}$, in the pre-fault network 122 to calculate the incremental quantities for the fault network 124 by using equations (1) and (2). Relays (e.g., line relay 1 and line relay 2) at the terminals 112 and 114 measure both the pre-fault network 122 and the faulted network 126 signals directly. For example, the incremental voltage $\Delta V$ and the incremental current $\Delta I$ of the fault network 124 may be determined based on measurements acquired (e.g., by the LEDs 102 and 104) at the source terminal 112 and the remote terminal 114 by using equations (1) and (2), respectively, as will be illustrated in FIGS. 3-5.

In a power network with balanced voltage sources, transposed lines, and balanced loads (i.e., balanced power network), only positive-sequence current and voltage exist in the pre-fault network, i.e., negative-sequence and zero-sequence quantities are zero in the pre-fault network. Consequently, in the balanced power network, only positive-sequence incremental quantities may be calculated by subtracting positive-sequence quantities between faulted and pre-fault networks, and the calculated negative- and zero-sequence quantities in the faulted network are equal to incremental negative- and zero-sequence quantities in the fault network.

In practice, transmission lines are often not transposed due to several factors, including the cost. Untransposed lines create unbalance situation in the pre-fault network and results in generation of negative- and zero-sequence voltages and currents in the pre-fault network. With non-zero negative- and zero-sequence quantities in the pre-fault network, incremental quantities in the fault network are no longer equal to the negative- and zero-sequence quantities in the faulted network. Consequently, non-zero negative- and zero-sequence quantities in the pre-fault network impact fault location estimation. These sequence quantities impact performance of many power system components, including protective relaying.

Figure 3:
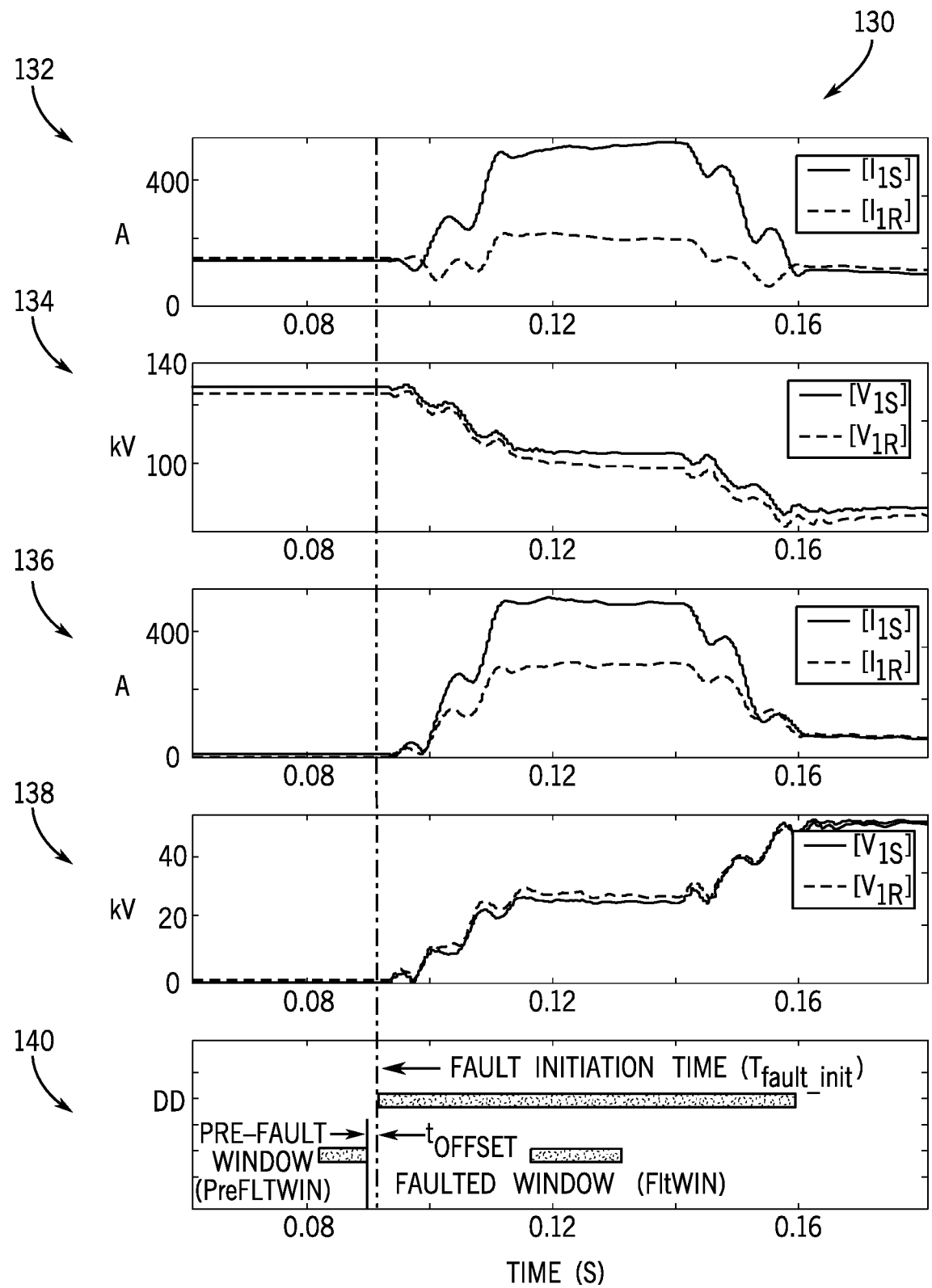
FIG. 3 illustrates timing diagrams for determining a location of the fault in the faulted circuit of FIG. 2, in accordance with an embodiment.

FIG. 3 shows a comparison 130 of phasor magnitudes for voltages and currents with respect to time before and after the fault 128 occurred on an internal phase A to ground loop, e.g., diagrams 132 and 134 are currents and voltages for positive-sequence fault network and diagrams 136 and 138 are currents and voltages for negative-sequence fault network, respectively. Diagram 140 shows a disturbance detector (DD) binary signal that is used to identify the fault initiation time ($T_{fault\_init}$), which indicates the start time of the fault 128. The fault initiation time is used as a reference to determine pre-fault data window (PreFltWin) and faulted data window (FltWin), as illustrated in diagram 140. The start time for FltWin depends on the phasor filter used in the relay. The start time for FltWin is delayed until the phasor filter can estimate faulted phasors accurately. A short time-offset $t_{offset}$ is applied to the PreFltWin to encounter for delay in assertion of the disturbance detector (DD). The width of the PreFltWin and FltWin are fixed separately. The phasors in PreFltWin and FltWin windows are used to calculate pre-fault phasors and faulted phasors.

Before the fault 128 occurred, i.e., in the pre-fault network, the pre-fault sequence quantities are calculated by taking an average, as illustrated in equations (3)-(10) for diagrams 132-138. When either the maximum or the minimum value of a sequence quantity is significantly higher/lower than the average value, i.e., the fluctuation of the sequence quantity is higher than a threshold range (may be determined based on the properties of the power network), the pre-fault sequence quantities are not used (e.g., forced to zero) to avoid possible errors caused by the fluctuation of the sequence quantity.

For diagrams 132 and 134, the pre-fault sequence quantities are determined by equations (3)-(6):

$$V_{1S\_Pre\text{-}fault} = \text{avg}(V_{1S} \text{ in PreFltWin}) \quad (3)$$

$$I_{1S\_Pre\text{-}fault} = \text{avg}(I_{1S} \text{ in PreFltWin}) \quad (4)$$

$$V_{1R\_Pre\text{-}fault} = \text{avg}(V_{1R} \text{ in PreFltWin}) \quad (5)$$

$$I_{1R\_Pre\text{-}fault} = \text{avg}(I_{1R} \text{ in PreFltWin}) \quad (6),$$

where $V_{1S\_Pre\text{-}fault}$ and $I_{1S\_Pre\text{-}fault}$ are pre-fault voltage and current at the source terminal 112 and $V_{1R\_Pre\text{-}fault}$ and $I_{1R\_Pre\text{-}fault}$ are pre-fault voltage and current at the remote terminal 114 for positive-sequence fault network. For diagrams 136 and 138, the pre-fault sequence quantities are determined by equations (7)-(10):

$$V_{2S\_Pre\text{-}fault} = \text{avg}(V_{2S} \text{ in PreFltWin}) \quad (7)$$

$$I_{2S\_Pre\text{-}fault} = \text{avg}(I_{2S} \text{ in PreFltWin}) \quad (8)$$

$$V_{2R\_Pre\text{-}fault} = \text{avg}(V_{2R} \text{ in PreFltWin}) \quad (9)$$

$$I_{2R\_Pre\text{-}fault} = \text{avg}(I_{2R} \text{ in PreFltWin}) \quad (10),$$

where $V_{2S\_Pre-fault}$ and $I_{2S\_Pre-fault}$ are pre-fault voltage and current at the source terminal 112 and $V_{2R\_Pre-fault}$ and $I_{2R\_Pre-fault}$ are pre-fault voltage and current at the remote terminal 114 for negative-sequence fault network.

After the fault 128 has occurred, i.e., in the faulted network, the faulted sequence quantities are obtained through corresponding phasor filters. The incremental quantities for fault network are calculated by subtracting pre-fault sequence quantities calculated in equations (3) to (10) above from corresponding sequence quantities in the faulted window (FltWin). For diagrams 132 and 134, the incremental quantities (e.g., $\Delta V_{1S}$, $\Delta I_{1S}$, $\Delta V_{1R}$, $\Delta I_{1R}$) are determined by equations (11)-(14):

$$\Delta V_{1S} = V_{1S\_Faulted} - V_{1S\_Pre-fault} \tag{11}$$

$$\Delta I_{1S} = I_{1S\_Faulted} - I_{1S\_Pre-fault} \tag{12}$$

$$\Delta V_{1R} = V_{1R\_Faulted} - V_{1R\_Pre-fault} \tag{13}$$

$$\Delta I_{1R} = I_{1R\_Faulted} - I_{1R\_Pre-fault} \tag{14},$$

where $V_{1S\_Faulted}$ and $I_{1S\_Faulted}$ are faulted voltage and current at the source terminal 112 and $V_{1R\_Faulted}$ and $I_{1R\_Faulted}$ are faulted voltage and current at the remote terminal 114 for positive-sequence fault network. For diagrams 136 and 138, the incremental quantities (e.g., $\Delta V_{2S}$, $\Delta I_{2S}$, $\Delta V_{2R}$, $\Delta I_{2R}$) are determined by equations (15)-(19):

$$\Delta V_{2S} = V_{2S\_Faulted} - V_{2S\_Pre-fault} \tag{15}$$

$$\Delta I_{2S} = I_{2S\_Faulted} - I_{2S\_Pre-fault} \tag{16}$$

$$\Delta V_{2R} = V_{2R\_Faulted} - V_{2R\_Pre-fault} \tag{17}$$

$$\Delta I_{2R} = I_{2R\_Faulted} - I_{2R\_Pre-fault} \tag{18},$$

where $V_{2S\_Faulted}$ and $I_{2S\_Faulted}$ are faulted voltage and current at the source terminal 112 and $V_{2R\_Faulted}$ and $I_{2R\_Faulted}$ are faulted voltage and current at the remote terminal 114 for negative-sequence fault network.

Figure 4:
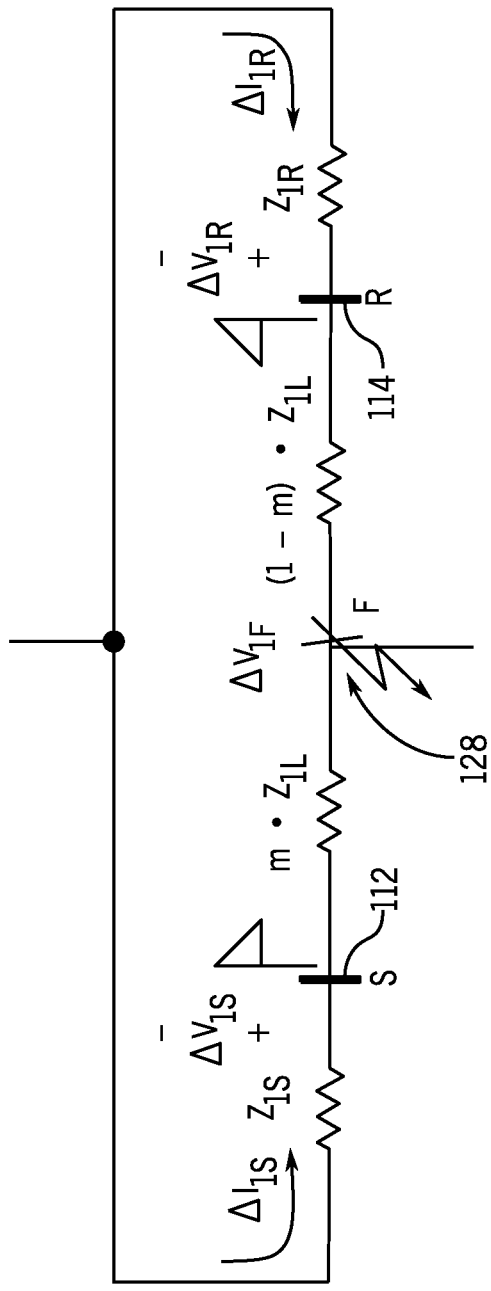
FIG. 4 illustrates an equivalent balanced power network used in FIG. 1, in accordance with an embodiment.
Figure 5:
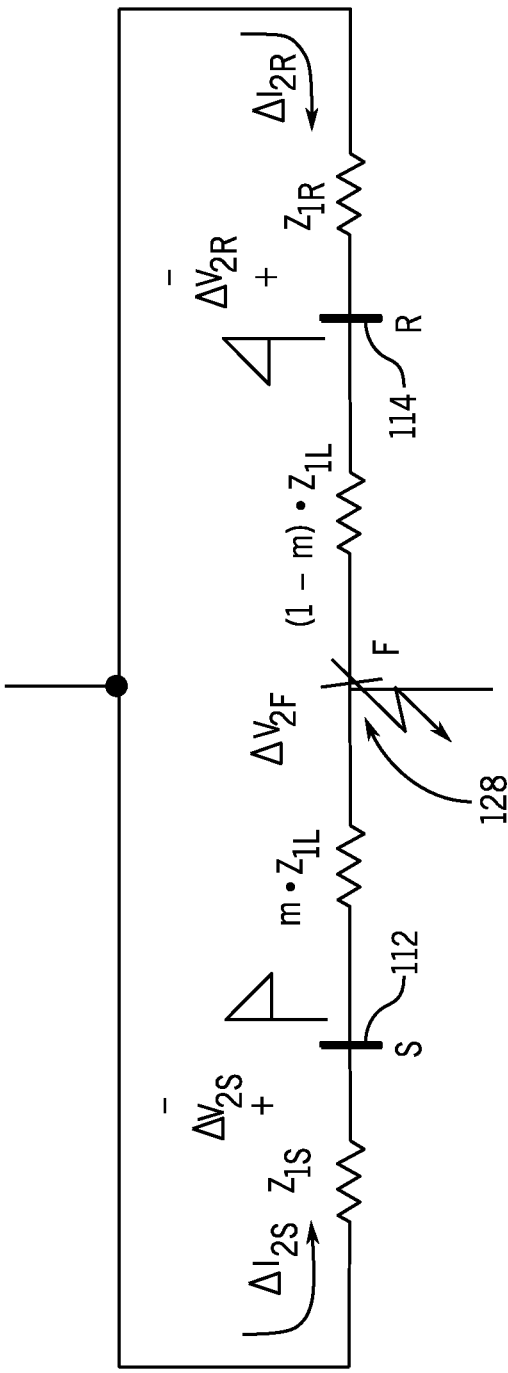
FIG. 5 illustrates an equivalent unbalanced power network used in FIG. 1, in accordance with an embodiment.

After the incremental quantities are determined, fault locations may be calculated by using the incremental quantities determined in the equations (11)-(18) described above for positive-sequence fault network and negative-sequence fault network, as illustrated in FIG. 4 and FIG. 5, respectively.

FIG. 4 illustrates an equivalent positive-sequence fault network. The fault location may be indicated by m, the per unit fault location from the source terminal 112, which may be calculated by using the incremental quantities calculated above in equations (11)-(14). For balanced fault (three-phase fault), fault location $m_{Balanced\_Fault}$ may be determined by solving positive-sequence fault network and incremental positive-sequence quantities, i.e., incremental quantities for positive-sequence quantities. The maximum and minimum values of $m_{Balanced\_Fault}$ may be discarded, and an average of the remaining values is the determined fault location for the given fault 128:

$$m_{Balanced\_Fault} = \text{real}\left(\frac{\Delta V_{1S} - \Delta V_{1R} + Z_{1L} \cdot \Delta I_{1R}}{Z_{1L} \cdot (\Delta I_{1S} + \Delta I_{1R})}\right), \tag{19}$$

where $Z_{1L}$ is the positive sequence transmission line impedance.

FIG. 5 illustrates an equivalent negative-sequence fault network. The fault location may be indicated by m, the per unit fault location from the source terminal 112, which may be calculated by using the incremental quantities calculated above in equations (15)-(18). For unbalanced faults, fault location $m_{Unbalanced\_Fault}$ may be determined by solving negative-sequence fault network and incremental negative-sequence quantities, i.e., incremental quantities for negative-sequence quantities. The maximum and minimum values of $m_{Unbalanced\_Fault}$ may be discarded, and an average of the remaining values is the determined fault location for the given fault 128:

$$m_{Unbalanced\_Fault} = \text{real}\left(\frac{\Delta V_{2S} - \Delta V_{2R} + Z_{1L} \cdot \Delta I_{2R}}{Z_{1L} \cdot (\Delta I_{2S} + \Delta I_{2R})}\right), \tag{20}$$

where $Z_{1L}$ is the positive sequence transmission line impedance.

Figure 6:
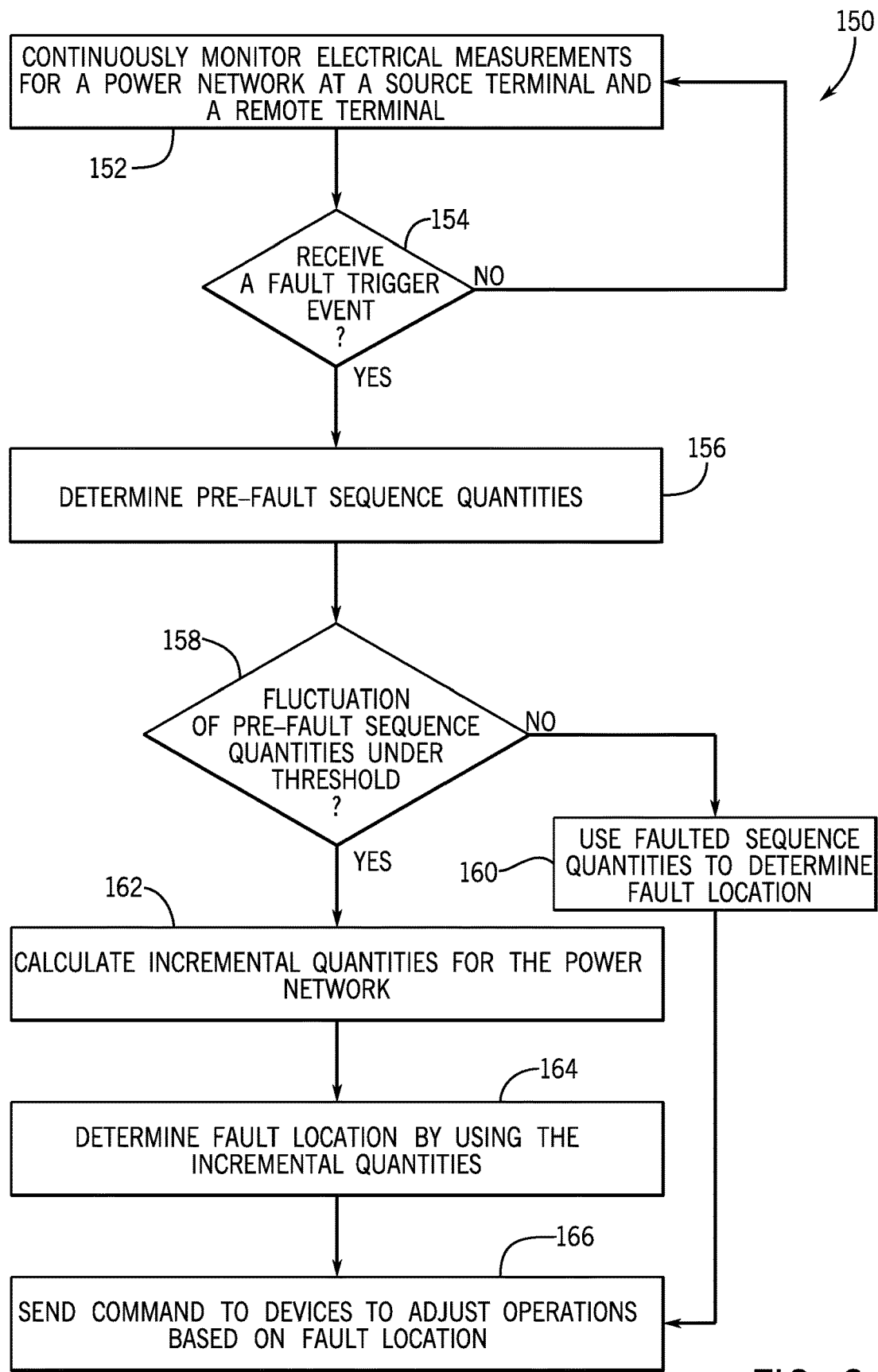
FIG. 6 is a flowchart of a method for determining a location of the fault in FIG. 1 using incremental quantities, in accordance with an embodiment.

FIG. 6 illustrate a flow chart of a method 150 for determining the fault location in accordance with embodiments described herein. Although the following description of the method 150 is described as being performed in a particular order, it should be noted that the method 150 may be performed in any suitable order. Moreover, it should be noted that the method 150 may be performed by any suitable computing system that may have certain processing capabilities. Further, the flow chart in FIG. 6 may be refined/enhanced based on system requirements.

For instance, the computing system may include a communication component, a processor, a memory, a storage, input/output (I/O) ports, a display, and the like. The communication component may facilitate communication between the computing system and the terminals 112 and 114 and any other suitable communication-enabled devices.

The processor may be any type of computer processor or microprocessor capable of executing computer-executable code. The processor may also include multiple processors that may perform the operations described below. The memory and the storage may be any suitable articles of manufacture that can serve as media to store processor-executable code, data, or the like. These articles of manufacture may represent computer-readable media (e.g., any suitable form of memory or storage) that may store the processor-executable code used by the processor to perform the presently disclosed techniques. The memory and the storage may store data, various other software applications for analyzing the data, and the like. The memory and the storage may represent non-transitory computer-readable media (e.g., any suitable form of memory or storage) that may store the processor-executable code used by the processor to perform various techniques described herein. It should be noted that non-transitory merely indicates that the media is tangible and not a signal.

The I/O ports may be interfaces that may couple to other peripheral components such as input devices (e.g., keyboard, mouse), sensors, input/output (I/O) modules, and the like. The display may operate to depict visualizations associated with software or executable code being processed by the processor. In an embodiment, the display may be a touch display capable of receiving inputs from a user. The display may be any suitable type of display, such as a liquid crystal display (LCD), plasma display, or an organic light emitting diode (OLED) display, for example.

Referring now to FIG. 6, at block 152, the computing system may continuously or periodically monitor the real-time and synchronized signals of electrical measurements for a power network at the source terminal 112 and the remote terminal 114. In some embodiments, the terminals 112 and 114 may include the LEDs 102 and 104, respectively, which may measure the electrical properties at the respective locations. The electrical measurements may include voltage measurements, current measurements, and the like in accordance to the equations described above. The IEDs 102 and 104 may then send data related to the electrical measurements to the computing system.

At block 154, the computing system may determine whether a fault is present based on receiving a notification of a fault trigger from any suitable device. The fault trigger may be identified based on values of the operating parameters of the system 100, such as the electrical operating parameters measured by electrical sensors monitoring the system 100, and/or the temperature of the operation environment of the system 100 measured by temperature sensors, etc. For example, when a fault occurs, values of one or more electrical operating parameters measured by the electrical sensors monitoring the system 100 may not be within corresponding predetermined ranges (e.g., an operating current larger than the predetermined allowable operating current range may indicate a short-circuit), which may be determined based on the properties and configurations of the system 100. In some embodiment, when a fault occurs, the temperature measurement of the operation environment measured by the temperature sensors monitoring the system 100 may get a value higher (or lower) than a threshold value, which may be predefined based on the operating parameters of the system 100. The fault trigger may be received from a device of the system 100 (e.g., a device connected directly with the computing system) or an external device outside of the system 100. In some embodiment, the fault trigger may be input to the computing system by a user. The computing system may start to calculate the incremental quantities in response to receiving the fault trigger.

At block 156, the computing system may determine the pre-fault sequence quantities according to FIG. 3 using the equations (3)-(10) described above. At block 158, the computing system may determine whether fluctuations of the pre-fault sequence quantities are within corresponding threshold ranges (e.g., the maximum or minimum value of corresponding sequence quantity is not significantly higher/lower than the corresponding average value). The threshold ranges may be determined based on the properties of the power network. If any of the pre-fault sequence quantities has a fluctuation more than its corresponding threshold range, the computing system may implement a method and corresponding system (which may be incorporated in the same computing system) that use the faulted sequence quantities to determine the fault location at block 160. That is, the computing system uses the faulted sequence quantities to determine the fault location rather than using the fault sequence quantities in order to avoid possible errors caused by the fluctuation of the sequence quantities. If any of the pre-fault sequence quantities has a fluctuation no more than its corresponding threshold range, the computing system may determine that it is appropriate to use the fault sequence quantities to determine the fault location. And, at block 162, the computing system may calculate the incremental quantities for the power network according to the equations (11)-(18) described above.

At block 164, the computing system may determine the fault location by using the incremental quantities calculated in block 162. The computing system may determine the fault location for a balanced fault by using the equation (19), and the unbalanced faults by using the equation (20), as described above.

After the fault and its location are determined, the computing system may send commands to related devices (e.g., contactors, relays, circuit breakers) to adjust operations based on the fault location at block 166. In addition, the fault location information may be used by dispatch crews for maintenance operations. For example, the operations might include a protective action, which may include opening or closing a circuit breaker, selectively isolating a portion of the electric power system via the breaker, etc. In various embodiments, the protective action may involve coordinating protective actions with other devices in communication with the system 100. In addition, the fault location computation can be used during post-processing actions to provide more visibility into the system like system parameters.

Figure 7A:
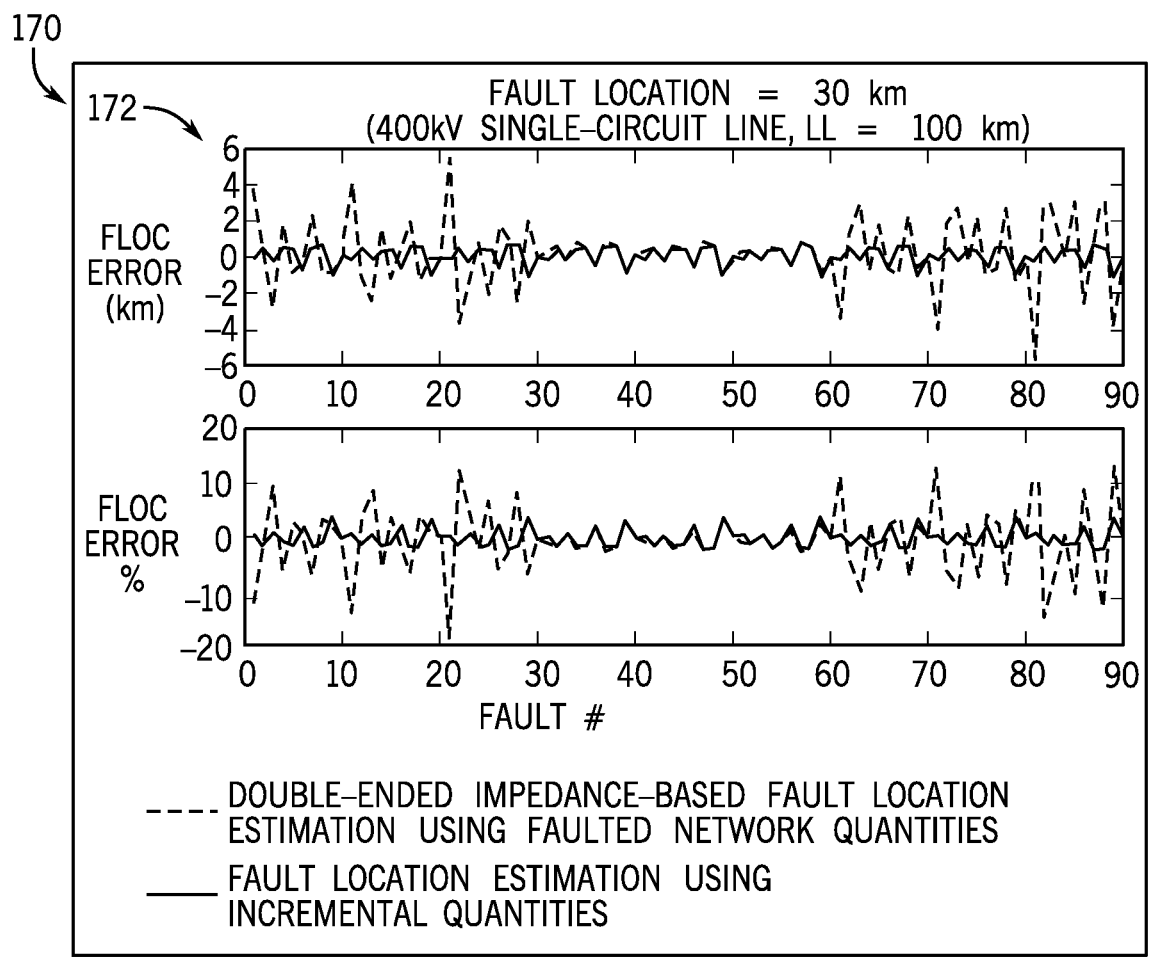
FIG. 7 is a comparison of results of determined fault locations, in accordance with an embodiment.
Figure 7B:
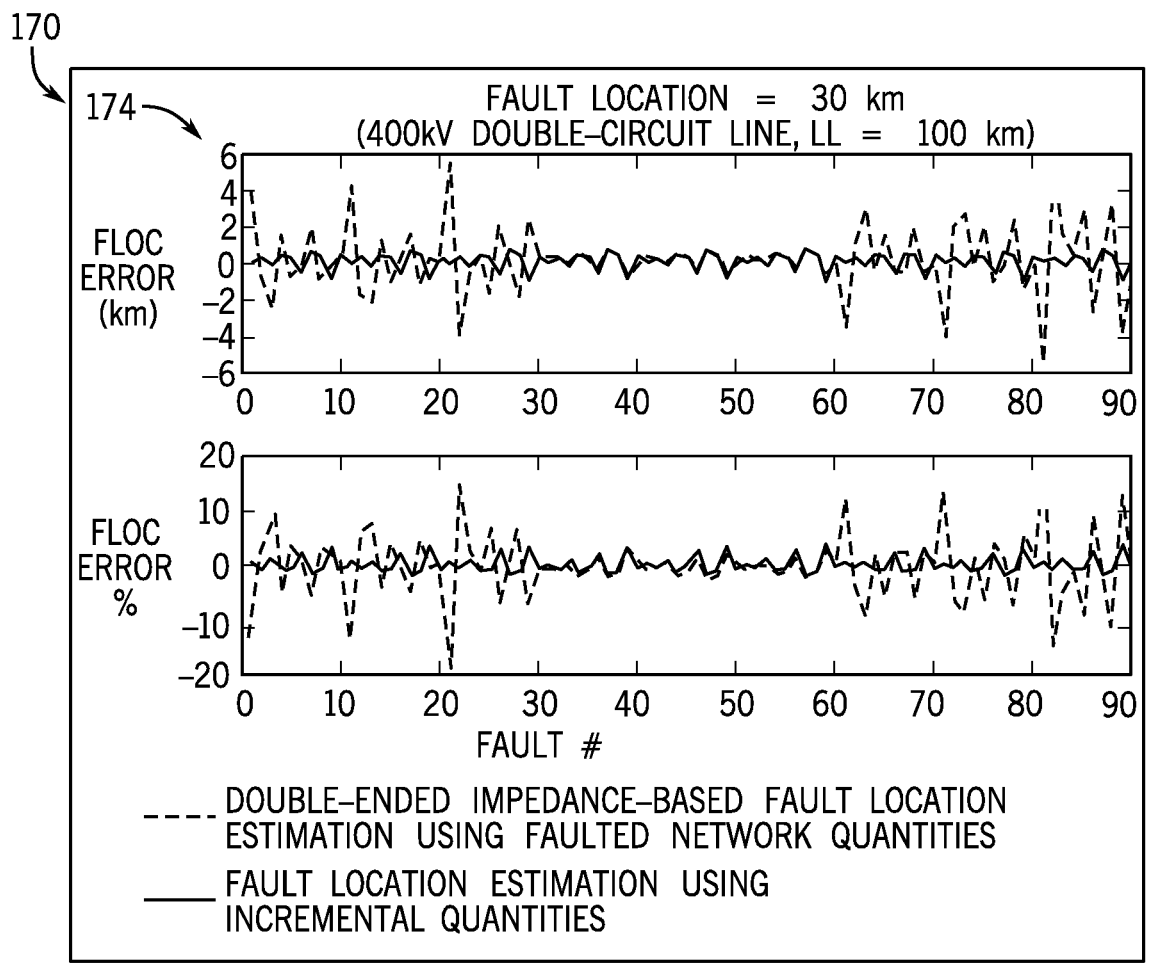
Figure 7C:
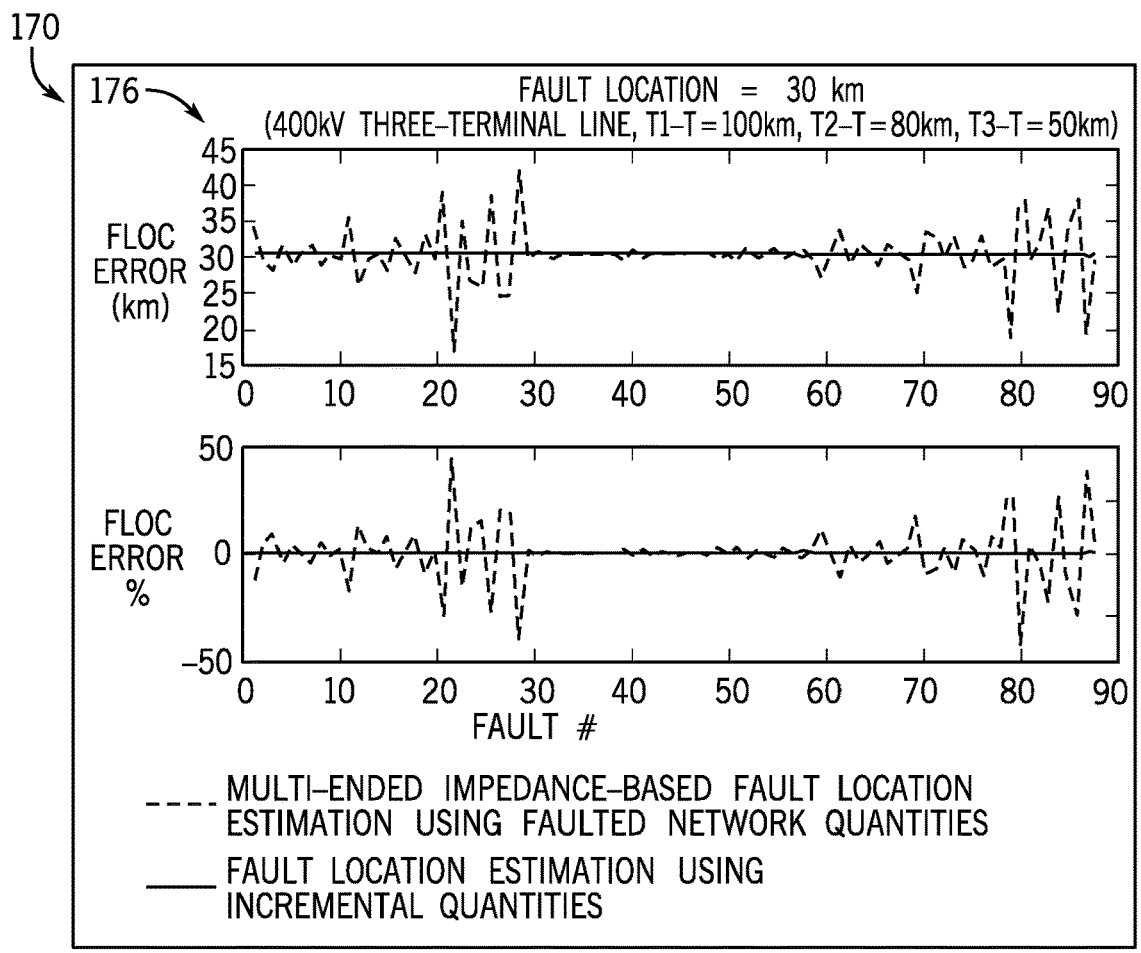

FIG. 7 shows a comparison 170 of results of fault locations determined by using different methods for different power networks. Test results from simulations are provided. For all test cases, transmission lines (e.g., line length (LL)= 100 km) are modeled as untransposed. Fault locations are calculated using double-ended impedance-based method using faulted network quantities (DEZFL) (in diagram 172 and 174), Multi-ended impedance-based fault location method using faulted network quantities (MEZFL) (in diagram 176), and the incremental quantities method, and results are illustrated with respect to the FLOC Error (km) and FLOC Error (%). For each fault location, faults are applied using the combination of load flow angle, fault resistance, and fault types described below (three phase electric power delivery system with phase A, phase B, and phase C):

Load Flow Angle: 20°, 1°, −20°
Fault Resistance: 0Ω, 10Ω, 40Ω
Fault Type: AG, BG, CG, AB, BC, CA, ABG, BCG, CAG, ABC In the above description, fault type AG indicates a fault on loop AG (i.e., phase A to ground), fault type BG indicates a fault on loop BG (i.e., phase B to ground), fault type CG indicates a fault on loop CG (i.e., phase C to ground), fault type AB indicates a fault on loop AB (i.e., phase B to phase A), fault type BC indicates a fault on loop BC (i.e., phase B to phase C), and fault type CA indicates a fault on loop CA (i.e., phase C to phase A). Fault types ABG, BCG, and CAG indicate double line-to-ground fault types. Fault type ABC indicates a triple-line fault type.

Diagram 172 shows fault locations calculated using a 400 kV single-circuit untransposed line modeled in a simulation tool. Test results for faults locations at 30 km are provided in diagram 172.

Diagram 174 shows fault locations calculated using a 400 kV double-circuit untransposed line with mutual coupling modeled in a simulation tool. Test results for faults locations at 30 km are provided in diagram 174.

Figure 8:
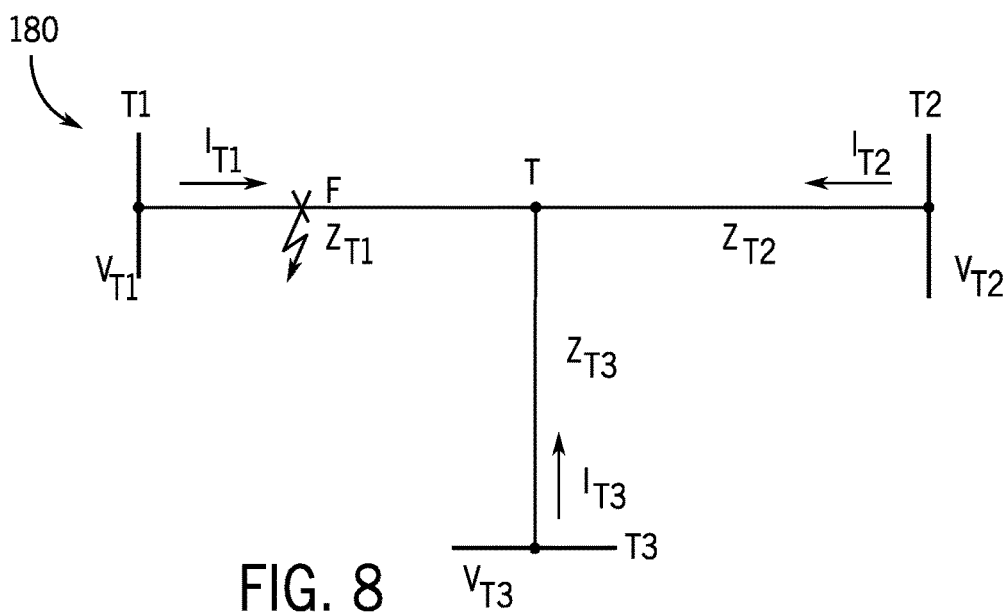
FIG. 8 is a block diagram of a system with a fault, in accordance with an embodiment.

Diagram 176 shows fault locations calculated using a 400 kV three-terminal untransposed line modeled in a simulation tool, as will be illustrated in FIG. 8. Test results for faults locations at 30 km are provided in diagram 176.

FIG. 8 illustrates a diagram 180 for the three-terminal untransposed line used in the diagram 176 of FIG. 7. The three-terminal line has relations as below:

$$T1-T=100 \text{ km}, T2-T=80 \text{ km, and } T3-T=50 \text{ km}.$$

The results in FIG. 7 show that the disclosed incremental quantities method provides better fault location estimates for power system with unbalance in pre-fault state (e.g. with untransposed lines). The proposed method uses two equations to estimate fault location for all ten fault types. Negative-sequence fault network and negative-sequence incremental quantities are used for fault location estimation for all unbalanced faults. For three-phase faults, positive-sequence fault network and positive-sequence incremental quantities are used.

Additionally, the present system and method is a good backup option for travelling-wave (TW) fault location method, e.g., for faults occurring near a point-on-wave zero or if the line is terminated with a high impedance element as it becomes a challenge to measure the current TW for such systems. Furthermore, fault type identification is not necessary in the present system and method, which avoids errors associated or challenges faced by fault identification methods.

It should be noted that the fault location mentioned in the embodiments described above pertains to per unit fault location, but this output can be used to calculate the actual fault location in miles or kilometers if the total line length is mentioned. Thus, technical effects of the present disclosure include systems and methods for using incremental quantities to determine fault location.

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform that may or may not include long-distance transmission of high-voltage power. Accordingly, many changes may be made to the details of the above-described embodiments without departing from the underlying principles of this disclosure. The scope of the present disclosure should, therefore, be determined only by the following claims.

Indeed, the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. A method to determine a location of a fault in a power network, comprising:
    monitoring in real-time, via a set of sensors, electrical measurements associated with a loop within the power network, wherein the set of sensors is disposed at a source terminal and a remote terminal of the loop, wherein the electrical measurements comprise current measurements with respect to time, voltage measurements with respect to time, or both measured at the source terminal and the remote terminal of the loop simultaneously;
    detecting a presence of the fault based on the electrical measurements not being within defined ranges or a temperature measured by a temperature sensor associated with the power network not being within a threshold range, wherein a fault initiation time is determined based on the presence of the fault;
    determining a pre-fault data window before the fault initiation time based on a defined time offset;
    determining, via one or more processors, pre-fault sequence quantities based on the pre-fault data window and the electrical measurements, wherein the pre-fault sequence quantities are determined based on average values of respective electrical measurements with respect to time over the pre-fault data window before the fault initiation time;
    determining a faulted data window after the fault initiation time based on a filter used for monitoring the electrical measurements;
    determining, via the one or more processors, faulted sequence quantities based on the faulted data window and the electrical measurements;
    based on respective fluctuations of the pre-fault sequence quantities during the pre-fault data window less than respective threshold ranges, determining, via the one or more processors, a set of incremental quantities based on the pre-fault sequence quantities and the faulted sequence quantities;
    calculating, via the one or more processors, the location of the fault based on the set of incremental quantities and a positive sequence transmission line impedance, wherein calculating the location of the fault results in a singular value; and
    performing a protective action comprising adjusting an operation of one or more devices of the power network based on the singular value of the location of the fault, wherein the one or more devices comprises a circuit breaker, and wherein the operation comprises opening or closing the circuit breaker.

2. The method of claim 1, wherein the one or more processors monitor the electrical measurements at two or more locations of the power network.

3. The method of claim 1, wherein the pre-fault sequence quantities are determined further based on the respective electrical measurements are within respective threshold ranges of corresponding average values of the respective electrical measurements before the fault initiation time.

4. The method of claim 3, wherein the pre-fault sequence quantities are set to zero if the respective electrical measurements are over respective threshold ranges of corresponding average values of the respective electrical measurements before the fault initiation time.

5. The method of claim 1, wherein the filter comprises a phasor filter.

6. The method of claim 1, wherein detecting the presence of the fault is performed by a device other than the one or more processors.

7. The method of claim 6, wherein the device comprises an intelligent electronic device.

8. The method of claim 1, wherein the loop within the power network comprises an untransposed transmission line.

9. The method of claim 1, wherein the set of sensors comprises intelligent electronic devices.

10. The method of claim 1, wherein the one or more devices comprise a remote terminal unit, a differential relay, a distance relay, a directional relay, a feeder relay, an overcurrent relay, a voltage regulator control, a voltage relay, a breaker failure relay, a generator relay, a motor relay, an automation controller, a bay controllers, meter, a recloser control, a communications processor, a computing platform, a programable logic controller (PLCs), a programmable automation controller, or an input and output module.

11. A system, comprising:
a set of sensors configured to acquire real-time electrical measurements associated with a loop within a power network, wherein the set of sensors is disposed at a source terminal and a remote terminal of the loop; and
one or more processors configured to:
monitor the electrical measurements associated with the loop within the power network via the set of sensors, wherein the electrical measurements comprise current measurements with respect to time, voltage measurements with respect to time, or both measured at the source terminal and the remote terminal of the loop simultaneously;
detect a presence of a fault based on the electrical measurements not being within defined ranges or a temperature measured by a temperature sensor associated with the power network not being within a threshold range, wherein a fault initiation time is determined based on the presence of the fault;
determine a pre-fault data window before the fault initiation time based on a defined time offset;
determine pre-fault sequence quantities based on the pre-fault data window and the electrical measurements, wherein the pre-fault sequence quantities are determined based on average values of respective electrical measurements with respect to time over the pre-fault data window before the fault initiation time;
determine a faulted data window after the fault initiation time based on a filter used for monitoring the electrical measurements;
determine faulted sequence quantities based on the faulted data window and the electrical measurements;
based on respective fluctuations of the pre-fault sequence quantities during the pre-fault data window less than respective threshold ranges, determine a set of incremental quantities based on the pre-fault sequence quantities and the faulted sequence quantities;
calculate a location of the fault based on the set of incremental quantities and a positive sequence transmission line impedance, wherein calculating the location of the fault results in a singular value; and
perform a protective action comprising adjusting an operation of one or more devices of the power network based on the singular value of the location of the fault, wherein the one or more devices comprises a circuit breaker, and wherein the operation comprises opening or closing the circuit breaker.

12. The system of claim 11, wherein the one or more processors monitor the electrical measurements at two or more locations of the power network.

13. The system of claim 11, wherein the loop within the power network comprises an untransposed transmission line.

14. The system of claim 11, wherein the one or more devices comprise a remote terminal unit, a differential relay, a distance relay, a directional relay, a feeder relay, an overcurrent relay, a voltage regulator control, a voltage relay, a breaker failure relay, a generator relay, a motor relay, an automation controller, a bay controllers, meter, a recloser control, a communications processor, a computing platform, a programmable logic controller (PLCs), a programmable automation controller, or an input and output module.

15. A non-transitory computer-readable medium comprising computer-executable instructions that, when executed, are configured to cause one or more processors to perform operations comprising:
monitoring real-time electrical measurements associated with a loop within a power network from a set of sensors, wherein the set of sensors is disposed at a source terminal and a remote terminal of the loop, wherein the electrical measurements comprise current measurements with respect to time, voltage measurements with respect to time, or both measured at the source terminal and the remote terminal of the loop simultaneously;
detecting a presence of a fault based on the electrical measurements not being within defined ranges or a temperature measured by a temperature sensor associated with the power network not being within a threshold range, wherein a fault initiation time is determined based on the presence of the fault;
determining a pre-fault data window before the fault initiation time based on a defined time offset;
determining pre-fault sequence quantities based on the pre-fault data window and the electrical measurements, wherein the pre-fault sequence quantities are determined based on average values of respective electrical measurements with respect to time over the pre-fault data window before the fault initiation time;
determining a faulted data window after the fault initiation time based on a filter used for monitoring the electrical measurements;
determining faulted sequence quantities based on the faulted data window and the electrical measurements;
based on respective fluctuations of the pre-fault sequence quantities during the pre-fault data window less than respective threshold ranges, determining a set of incremental quantities based on the pre-fault sequence quantities and the faulted sequence quantities;
calculating a location of the fault based on the set of incremental quantities and a positive sequence transmission line impedance, wherein calculating the location of the fault results in a singular value; and
performing a protective action comprising adjusting an operation of one or more devices of the power network based on the singular value of the location of the fault, wherein the one or more devices comprises a circuit breaker, and wherein the operation comprises opening or closing the circuit breaker.

16. The non-transitory computer-readable medium of claim 15, wherein the one or more devices comprise a remote terminal unit, a differential relay, a distance relay, a directional relay, a feeder relay, an overcurrent relay, a voltage regulator control, a voltage relay, a breaker failure relay, a generator relay, a motor relay, an automation controller, a bay controllers, meter, a recloser control, a communications processor, a computing platform, a programmable logic controller (PLCs), a programmable automation controller, or an input and output module.

17. The non-transitory computer-readable medium of claim 15, wherein a disturbance detector binary signal is used to identify the fault initiation time.

18. The non-transitory computer-readable medium of claim 15, wherein the loop within the power network comprises an untransposed transmission line.

19. The non-transitory computer-readable medium of claim 15, wherein the set of sensors comprises intelligent electronic devices.

* * * * *